United States Patent
Kang et al.

(10) Patent No.: US 9,410,234 B2
(45) Date of Patent: Aug. 9, 2016

(54) SPUTTERING DEVICE AND METHOD OF FORMING LAYER USING THE SAME

(71) Applicant: Samsung Display Co., Ltd., Yongin (KR)

(72) Inventors: Hyun Ju Kang, Pocheon-si (KR); Sang Woo Sohn, Yongin-si (KR); Sang Won Shin, Yongin-si (KR); Dong Hee Lee, Hwaseong-si (KR); Chang Oh Jeong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/670,403

(22) Filed: Mar. 26, 2015

(65) Prior Publication Data

US 2016/0160340 A1 Jun. 9, 2016

(30) Foreign Application Priority Data

Dec. 8, 2014 (KR) ........................ 10-2014-0174898

(51) Int. Cl.
C23C 14/34 (2006.01)
C23C 14/04 (2006.01)
(52) U.S. Cl.
CPC .................................... C23C 14/044 (2013.01)
(58) Field of Classification Search
CPC .. C23C 14/34; H01J 37/3438; H01J 37/3441; H01J 37/3447

USPC .............. 204/192.12, 298.11, 298.14, 298.06
See application file for complete search history.

(56) References Cited

U.S. PATENT DOCUMENTS

| | | | | |
|---|---|---|---|---|
| 3,361,659 | A | * 1/1968 | Bertelsen | ............ H01J 37/3402 |
| | | | | 148/100 |
| 2002/0023831 | A1 | * 2/2002 | Iwase | ................... C23C 14/228 |
| | | | | 204/192.12 |
| 2014/0033980 | A1 | 2/2014 | Jeong | |

FOREIGN PATENT DOCUMENTS

| KR | 10-2001-0107142 | 12/2001 |
|---|---|---|
| KR | 10-2014-0036765 | 3/2014 |

* cited by examiner

*Primary Examiner* — Rodney McDonald
(74) *Attorney, Agent, or Firm* — H.C. Park & Associates, PLC

(57) ABSTRACT

Provided are a sputtering device and a method of forming a layer using the same.

The method of forming a layer using the sputtering device includes: placing a substrate within a chamber; depositing target particles emitted from a target, which faces the substrate, on the substrate using a sputtering process; and horizontally moving a plurality of shield rods, which are installed in a shield mask disposed between the substrate and the target and are separated from each other along a first direction, during the sputtering process.

14 Claims, 16 Drawing Sheets

SPUTTERING DEVICE AND METHOD OF FORMING LAYER USING THE SAME

CROSS-REFERENCE TO RELATED APPLICATION

This application claims priority from and the benefit of Korean Patent Application No. 10-2014-0174898 filed on Dec. 8, 2014, which is hereby incorporated by reference for all purposes as if fully set forth herein.

BACKGROUND OF THE INVENTION

1. Field

Exemplary embodiments relate to a sputtering device and a method of forming a layer using the same.

2. Discussion of the Background

As personal computers (PCs), televisions, etc. become lighter and thinner, display devices are also being required to become lighter and thinner. To meet this demand, flat panel display devices such as liquid crystal display devices (LCDs) are replacing cathode ray tubes (CRTs).

An LCD is a display device that obtains a desired image by applying an electric field to a liquid crystal material having dielectric anisotropy injected between two substrates and controlling the amount of light transmitting through the substrates by adjusting the intensity of the electric field. The LCD is a flat panel display that is easy to carry. Of various types of LCDs, thin-film transistor LCDs (TFT LCDs) using thin-film transistors (TFTs) as switching elements are mostly being utilized.

A sputtering device is one of the devices widely used to deposit a thin layer (e.g., a metal thin layer) on a substrate (e.g., a substrate for semiconductor elements or a substrate for LCDs). The sputtering device is considered as one of the important devices essential in manufacturing LCDs.

In the sputtering process using the sputtering device, a thin layer is typically deposited as follows. Power is supplied to a target installed within a chamber, and an inert gas such as an argon gas or an oxygen ($O_2$) gas is injected into the chamber. Then, an electric field is formed between the substrate and the target. The inert gas is ionized by the electric field to create plasma, and ions from the ionized inert gas collide with the target. Here, target particles are emitted from the target, and the emitted target particles are deposited on a substrate (e.g., a substrate for semiconductor elements or a substrate for LCDs) to form a thin layer.

The sputtering device includes a shield mask which has an opening and is disposed between the substrate and the target to form an electric field with the target and a plurality of shield rods which are installed in the shield mask to traverse the opening and allow a uniform electric field to be formed between the target and the shield mask.

However, since the shield rods lie in the path of the target particles heading for the substrate, they may serve as a hindrance to the movement of the target particles emitted from the target. In this case, the uniformity of a thin layer formed on the substrate may deteriorate.

The above information disclosed in this Background section is only for enhancement of understanding of the background of the inventive concept, and, therefore, it may contain information that does not form the prior art that is already known in this country to a person of ordinary skill in the art.

SUMMARY

Aspects of the present invention provide a sputtering device and a method of forming a thin layer using the sputtering device which can improve the uniformity of a thin layer formed on a substrate.

Additional aspects will be set forth in the detailed description which follows, and, in part, will be apparent from the disclosure, or may be learned by practice of the inventive concept.

According to exemplary embodiments, a sputtering device includes, a chamber, a stage which is disposed within the chamber and on which a substrate is placed, a target which is disposed within the chamber to face the stage, a shield mask which is disposed between the stage and the target and includes a plurality of sidewalls defining an opening and a plurality of housing grooves respectively formed in two facing ones of the sidewalls, a plurality of moving members which are respectively housed in the housing grooves, each of the moving members includes a plurality of coupling grooves separated from each other along a first direction, and are configured to move horizontally in the first direction, and a plurality of shield rods which extend along a second direction perpendicular to the first direction and are coupled to the coupling grooves of the moving members to be moved horizontally by the horizontal movement of the moving members.

The sputtering device may further include a driving unit which drives the moving members.

The moving members may be configured to move back and forth between first and second sides of the target.

The moving members may be configured to move horizontally at a predetermined speed in a direction from the first side of the target toward the second side of the target and move horizontally at the predetermined speed in a direction from the second side of the target toward the first side of the target.

The moving members may be configured to repeat an action of moving horizontally at a predetermined speed in a direction from the first side of the target toward the second side of the target and halting for a predetermined period of time and repeat an action of moving horizontally at the predetermined speed in a direction from the second side of the target toward the first side of the target and halting for the predetermined period of time.

A diameter of each of the shield rods may be equal to a distance between adjacent shield rods.

According to another aspect of the present invention, a sputtering device includes, a chamber, a stage which is disposed within the chamber and on which a substrate is placed, a target which is disposed within the chamber to face the stage, a shield mask which is disposed between the stage and the target, includes a plurality of sidewalls defining an opening and a plurality of coupling grooves formed in two facing ones of the sidewalls to be separated from each other along a first direction, and is configured to move horizontally in the first direction, and a plurality of shield rods which extend along a second direction perpendicular to the first direction and are coupled to the coupling grooves of the shield mask to be moved horizontally by the horizontal movement of the shield mask.

The sputtering device may further include a driving unit that drives the shield mask.

The shield mask may be configured to move back and forth between first and second sides of the target.

The shield mask may be configured to move horizontally at a predetermined speed in a direction from the first side of the target toward the second side of the target and move horizontally at the predetermined speed in a direction from the second side of the target toward the first side of the target.

The shield mask may be configured to repeat an action of moving horizontally at a predetermined speed in a direction from the first side of the target toward the second side of the target and halting for a predetermined period of time and repeat an action of moving horizontally at the predetermined speed in a direction from the second side of the target toward the first side of the target and halting for the predetermined period of time.

A diameter of each of the shield rods may be equal to a distance between adjacent shield rods.

According to still another aspect of the present invention, there is provided a method of forming a thin layer, the method including: placing a substrate within a chamber; depositing target particles emitted from a target, which faces the substrate, on the substrate using a sputtering process; and horizontally moving a plurality of shield rods, which are installed in a shield mask disposed between the substrate and the target and are separated from each other along a first direction, during the sputtering process.

The horizontally moving of the shield rods may include moving the shield rods back and forth between first and second sides of the target.

The horizontally moving of the shield rods may include horizontally moving the shield rods at a predetermined speed in a direction from the first side of the target toward the second side of the target and horizontally moving the shield rods at the predetermined speed in a direction from the second side of the target toward the first side of the target.

The horizontally moving of the shield rods may include repeating an action of horizontally moving the shield rods at a predetermined speed in a direction from the first side of the target toward the second side of the target and halting the shield rods for a predetermined period of time and repeating an action of horizontally moving the shield rods at the predetermined speed in a direction from the second side of the target toward the first side of the target and halting the shield rods for the predetermined period of time.

The horizontally moving of the shield rods may be performed as a plurality of moving members housed in the shield mask and coupled to the shield rods move horizontally in the first direction.

The horizontally moving of the shield rods may be performed as the shield mask coupled to the shield rods moves horizontally in the first direction.

A diameter of each of the shield rods may be equal to a distance between adjacent shield rods.

A layer formed by the deposition of the target particles on the substrate may be a metal thin layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
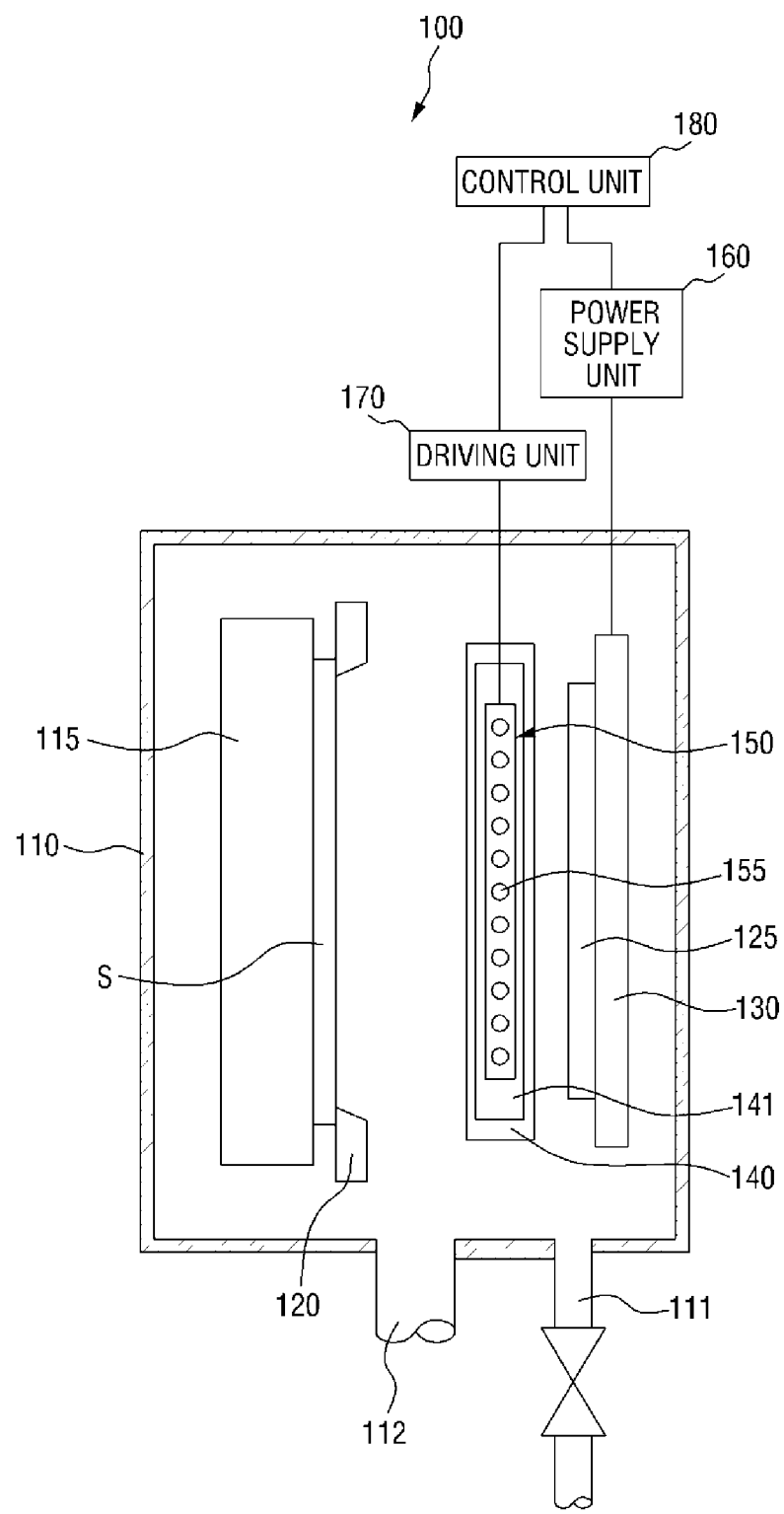
FIG. 1 is a schematic diagram of a sputtering device according to an embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, embodiments of the present invention will be described with reference to the attached drawings.

Figure 2:
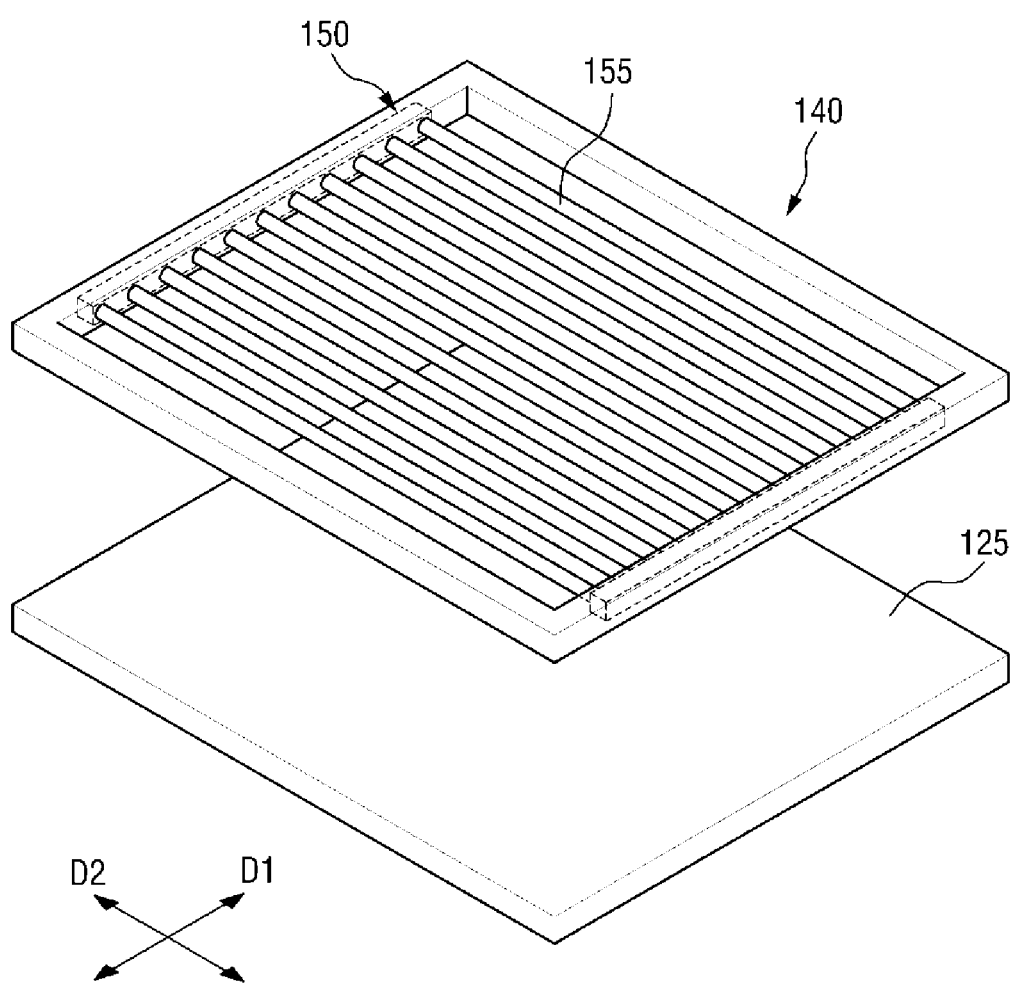
FIG. 2 is a perspective view illustrating the arrangement of a target, a shield mask, shield rods, and moving members illustrated in FIG. 1.
Figure 3:
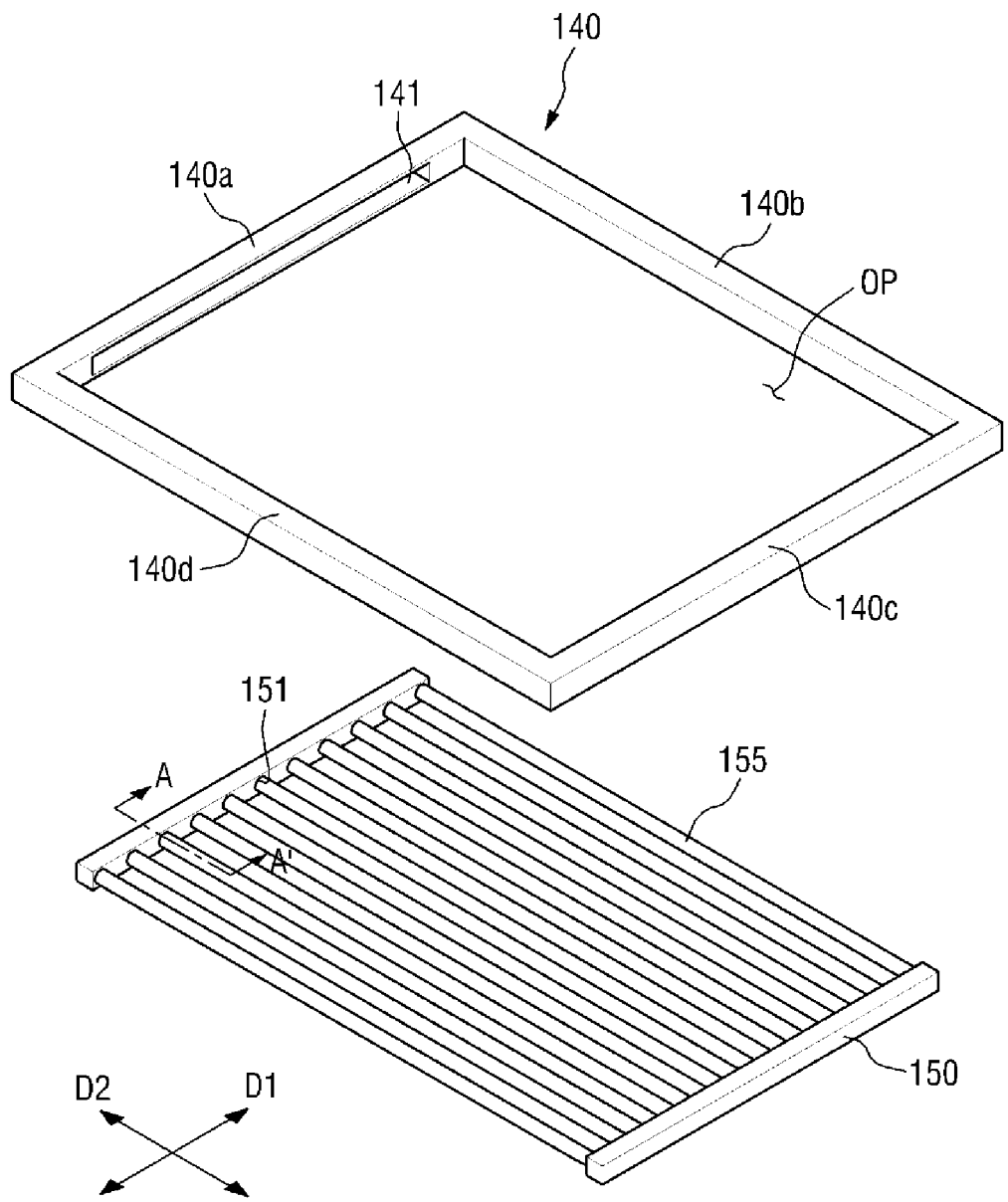
FIG. 3 is a perspective view of the shield mask and the shield rods and the moving members separated from the shield mask.
Figure 4:
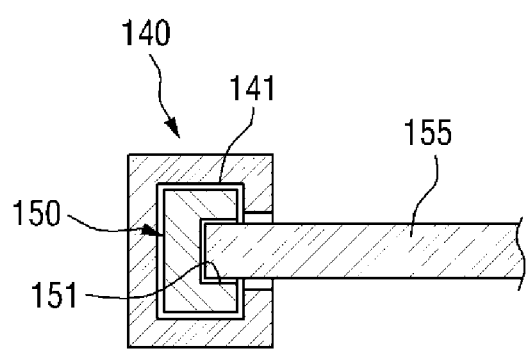
FIG. 4 is a cross-sectional view taken along the line A-A' of FIG. 3.
Figure 5:
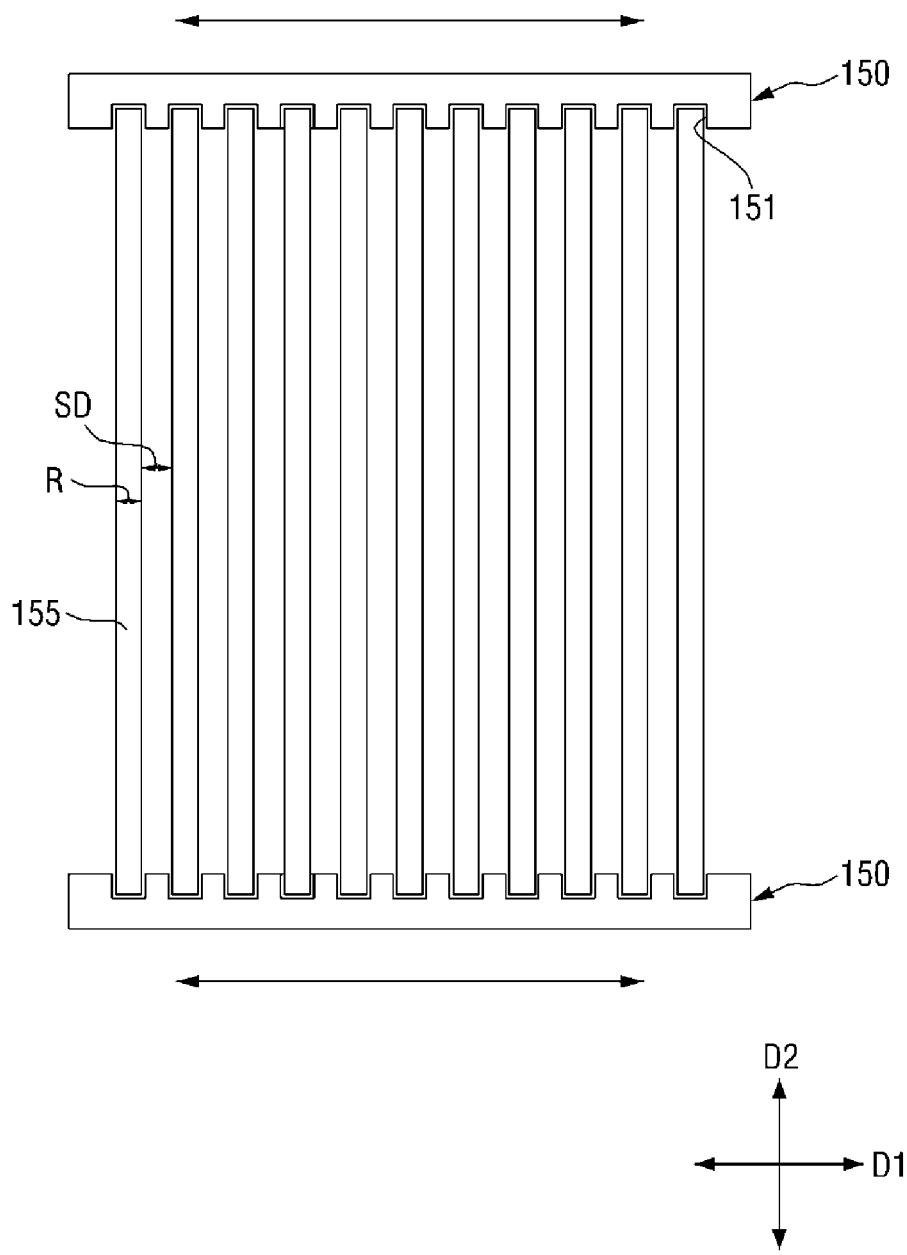
FIG. 5 is a plan view of the shield rods and the moving members illustrated in FIG. 3.

FIG. 1 is a schematic diagram of a sputtering device 100 according to an embodiment of the present invention. FIG. 2 is a perspective view illustrating the arrangement of a target 125, a shield mask 140, shield rods 155, and moving members 150 illustrated in FIG. 1. FIG. 3 is a perspective view of the shield mask 140 and the shield rods 155 and the moving members 150 separated from the shield mask 140. FIG. 4 is a cross-sectional view taken along the line A-A' of FIG. 3. FIG. 5 is a plan view of the shield rods 155 and the moving members 150 illustrated in FIG. 3.

Referring to FIGS. 1 through 5, the sputtering device 100 includes a chamber 110, a stage 115, a mask 120, the target 125, a backplate 130, the shield mask 140, the moving members 150, the shield rods 155, a power supply unit 160, a driving unit 170, and a control unit 180. The sputtering device 100 is a device that performs a sputtering process. The sputtering process is one of methods of depositing a thin layer on a substrate S.

The chamber 110 forms an internal space in which a vacuum can be created. The chamber 110 may include a gas supply pipe 111 and a gas discharge pipe 112 at a side thereof. An inert gas such as an argon gas is supplied into the chamber 110 through the gas supply pipe 111, and a process gas remaining in the chamber 110 after a process is discharged from the chamber 110 through the gas discharge pipe 112. Although not illustrated in the drawings, an entrance through which the substrate S can be fed into or taken out from the chamber 110 may be formed at the other side of the chamber 110. The chamber 110 may be in an electrically ground state.

The stage 115 may be disposed on a side within the chamber 110 and provide a space on which the substrate S can be placed. The substrate S may be a substrate for display devices. For example, the substrate S may be a substrate for display devices such as organic light-emitting display devices (OLEDs), liquid crystal display devices (LCDs) and plasma display panels (PDPs). The substrate S may be a bare substrate or a substrate having structures such as thin layers or wirings.

The mask 120 is placed on the substrate S and used to form a thin layer at a desired location on the substrate S. The mask 120 may be in the electrically ground state.

The target 125 is placed on the other side within the chamber 110 to face the stage 115. The target 125 may be made of a material of a thin layer that is to be formed on the substrate S. The target 125 is a source that forms a thin layer on the substrate S by generating target particles in response to an electric field. The target 125 may be made of a metal material such as aluminum, an aluminum alloy, refractory metal silicide, gold, copper, titanium, titanium-tungsten, tungsten, and molybdenum or an inorganic material such as silicon dioxide.

The target 125 receives power (e.g., negative (−) power) from the power supply unit 160 outside the chamber 110 via the backplate 130. The negative (−) power may be supplied in the form of a direct current (DC) or an alternating current (AC). When the negative (−) power is supplied to the target 125, an electric field is formed between the target 125 and the shield mask 140 in the electrically ground state. The electric field ionizes an inert gas, creating plasma. For example, an argon gas is ionized into Ar+ positive ions and electrons, and the Ar+ positive ions collide with the target 125. Accordingly, the target 125 is sputtered. Thus, target particles are emitted from the target 125 and deposited on the substrate S.

The backplate 130 is installed on the target 125 to support the target 125 and delivers power received from the power supply unit 160 to the target 125.

The shield mask 140 is disposed between the stage 115 and the target 125. Referring to FIG. 3, the shield mask 140 includes a plurality of sidewalls 140a, 140b, 140c, and 140d which define an opening OP and a plurality of housing grooves 141 which are respectively formed in two (140a and 140c) of the sidewalls 140a through 140d which face each other. The shield mask 140 is electrically independent from the target 125. The shield mask 140 is in the electrically ground state and forms an electric field with the target 125 to which power (e.g., negative (−) power) is supplied. The shield mask 140 may be made of aluminum or molybdenum. The opening OP may correspond to the substrate S.

The moving members 150 are respectively housed in the housing grooves 141 of the shield mask 140 and each includes a plurality of coupling grooves 151 which are separated from each other along a first direction D1. The moving members 150 may be configured to move horizontally in the first direction D1. For example, the moving members 150 may be configured to move back and forth between first and second sides of the target 125 at a predetermined speed in the first direction D1. In some embodiments, the moving members 150 may be configured to move horizontally from the first side of the target 125 toward the second side of the target 125 at a predetermined speed in the first direction D1 and then, without a halt, move horizontally from the second side toward the first side of the target 125 at the predetermined speed. Alternatively, the moving members 150 may be configured to repeat the action of moving horizontally from the first side toward the second side of the target 125 at a predetermined speed in the first direction D1 and then halting for a predetermined period of time and repeat the action of moving horizontally from the second side toward the first side of the target 125 at the predetermined speed and then halting for the predetermined period of time.

In FIGS. 1 through 5, each of the moving members 150 is formed as a moving block. However, the present invention is not limited thereto. For example, each of the moving members 150 may include a moving block and a guide rail.

The shield rods 155 may extend in a second direction D2 perpendicular to the first direction D and may be coupled to the coupling grooves 151 of the moving members 150. In this case, the shield rods 155 are separated from each other along the first direction D1. Referring to FIG. 5, a diameter R of each of the shield rods 155 may be, but is not limited to, equal to a distance SD between adjacent shield rods 155.

The shield rods 155 may be made of the same material as the shield mask 140 and may be electrically independent from the target 125. The shield rods 155 may form an electric field with the target 125, thereby reducing the non-uniformity of the intensity of an electric field formed between the shield mask 140 and the target 125 due to the decreasing intensity of the electric field toward a center of the opening OP. Accordingly, this reduces non-uniformity in the ion efficiency of an inert gas in different regions, which, in turn, overcomes deterioration in the emission uniformity of particles from the target 125.

In a sputtering process performed on the substrate S, the shield rods 155 may move horizontally by the horizontal movement of the moving members 150. For example, the shield rods 155 may move back and forth between the first and second sides of the target 125 at a predetermined speed in the first direction D1 by the horizontal movement of the moving members 150. In some embodiments, the horizontal movement of the moving members 150 may cause the shield rods 155 to move horizontally from the first side of the target 125 toward the second side of the target 125 at a predetermined speed in the first direction D1 and then, without a halt, move horizontally from the second side toward the first side of the target 125 at the predetermined speed. Alternatively, the horizontal movement of the moving members 150 may cause the shield rods 155 to repeat the horizontal moving from the first side toward the second side of the target 125 at a predetermined speed in the first direction D1 and then halting for a predetermined period of time and repeat the horizontal moving from the second side toward the first side of the target 125 at the predetermined speed and then halting for the predetermined period of time.

These movable shield rods 155 can reduce occasions that the target particle movement emitted from the target 125 in a sputtering process is continuously hindered at certain parts. Accordingly, it can be overcome that the movement of the target particles emitted from the target 125 in the sputtering process performed on the substrate S is hindered by the shield rods 155 when the shield rods 155 are fixed between the target 125 and the shield mask 140. This can enhance the uniformity of a thin layer, which is formed by the deposition of the target particles on the substrate S. It is because the target particles fail to properly deposit on portions of the substrate S that correspond to the shield rods 155 if they are fixed between the target 125 and the shield mask 140.

Referring to FIG. 1, the power supply unit 160 is disposed outside the chamber 110 and supplies power to the target 125 via the backplate 130. For example, the power supply unit 160 may supply negative (−) power to the target 125, thereby forming an electric field needed for the sputtering process between the target 125 and the shield mask 140 in the electrically ground state and the shield rods 155. The power supply unit 160 may include a power supply and supply negative (−) power in the form of a direct current or an alternating current.

The driving unit 170 drives the moving members 150. It includes driving devices, for example, a motor and a ball screw. The motor may move the moving members 150 horizontally in the first direction D1.

The control unit 180 may be connected to the power supply unit 160 to control the power supply of the power supply unit 160 and may be connected to the driving unit 170 to control the driving of the moving members 150. In addition, the control unit 180 may control the overall sputtering process performed on the substrate S within the chamber 110. For example, the control unit 180 may control the supply of an inert gas into the chamber 110 and the discharge of a process gas from the chamber 110. The control unit 180 may be implemented as hardware, software, or a computer or similar device using a combination of the hardware and the software.

Although not illustrated in the drawings, the backplate 130 may further have a magnet around it in order to increase an ionization rate of an inert gas, thereby improving the deposition speed and the quality of a deposited layer. The magnet may be a magnet or magnetic coil that forms a magnetic field.

As described above, the sputtering device 100 according to the exemplary embodiment of the present invention includes the shield rods 155, which can move horizontally, in the shield mask 140 disposed between the stage 115 and the target 125 to form an electric field. Therefore, the sputtering device 100 can form a uniform electric field between the target 125 and the shield mask 140. This reduces occasions that the target particle movement is continuously hindered at certain parts.

Hence, the sputtering device 100 according to the present invention can enhance the emission uniformity of target particles from the target 125.

A method of forming a layer using the sputtering device 100 of FIG. 1 will now be described.

FIGS. 6 through 11 are schematic diagrams illustrating steps of a method of forming a thin layer using the sputtering device 100 of FIG. 1.

Figure 6:
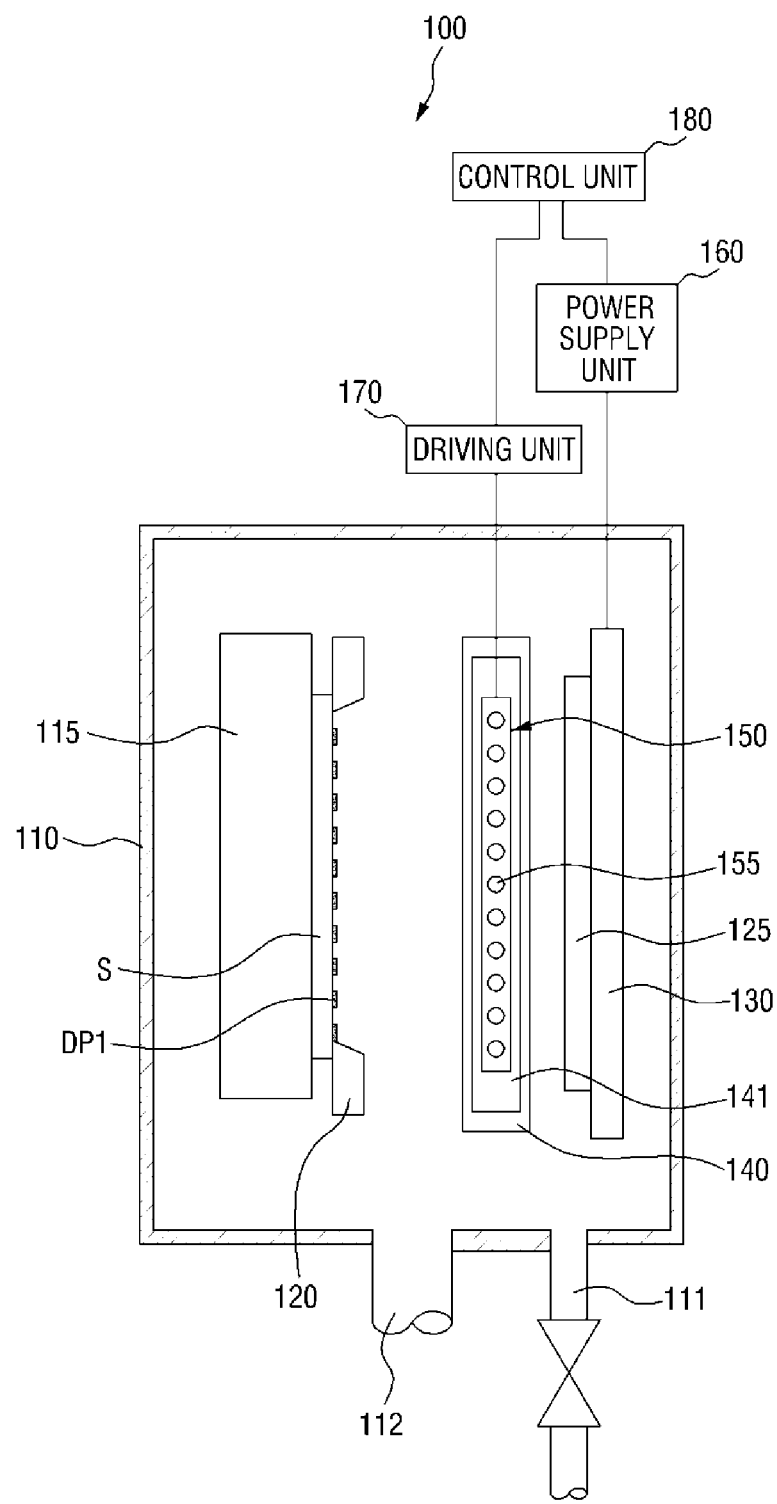
FIGS. 6 through 11 are schematic diagrams illustrating steps of a method of forming a thin layer using the sputtering device of FIG. 1.

Referring to FIG. 6, a substrate S is placed on the stage 115 installed within the chamber 110, and a target 125 is placed on back plate 130 to face the stage 115. Target particles emitted from the target 125 are deposited on the substrate S in a sputtering process. The sputtering process may be performed as follows. The control of the control unit 180 supplies power from the power supply unit 160 to the target 125, and supplies an inert gas such as an argon gas into the chamber 110 through the gas supply pipe 111 of the chamber 110. Then, an electric field is formed between the shield mask 140 including the shield rods 155 and the target 125. The electric field ionizes the inert gas, creating plasma. As ions from the ionized inert gas collide with the target 125, target particles are emitted from the target 125 and deposited on the substrate S.

The substrate S may be a substrate for display devices such as OLEDs, LCDs and PDPs. The target 125 may be made of a material of a thin layer that is to be formed on the substrate S. It will hereinafter be assumed that the material of the thin layer is a material of a metal thin layer, for example, an electrode layer of a thin-film transistor.

Before moving the moving members 150, deposition patterns DP1 may be formed on the substrate S by the sputtering process. The deposition patterns DP1 may be formed in a type that the target particles emitted from the target 125 are not deposited on the portion of the substrate which correspond to the shield rods 155, as illustrated in FIG. 6.

Referring to FIGS. 7 through 11, during the sputtering process performed on the substrate S, the control unit 180, through the driving unit 170, moves the moving members 150 horizontally between first and second sides of the target 125 at a predetermined speed in the first direction D1. Accordingly, the shield rods 155 coupled to the moving members 150 may move horizontally between the first and second sides of the target 125 at the predetermined speed in the first direction D1. This can reduce cases where the movement of the target particles emitted from the target 125 in the sputtering process performed on the substrate S is continuously hindered at certain parts, thereby improving the uniformity of a thin layer formed by the deposition of the target particles on the substrate S.

Figure 7:
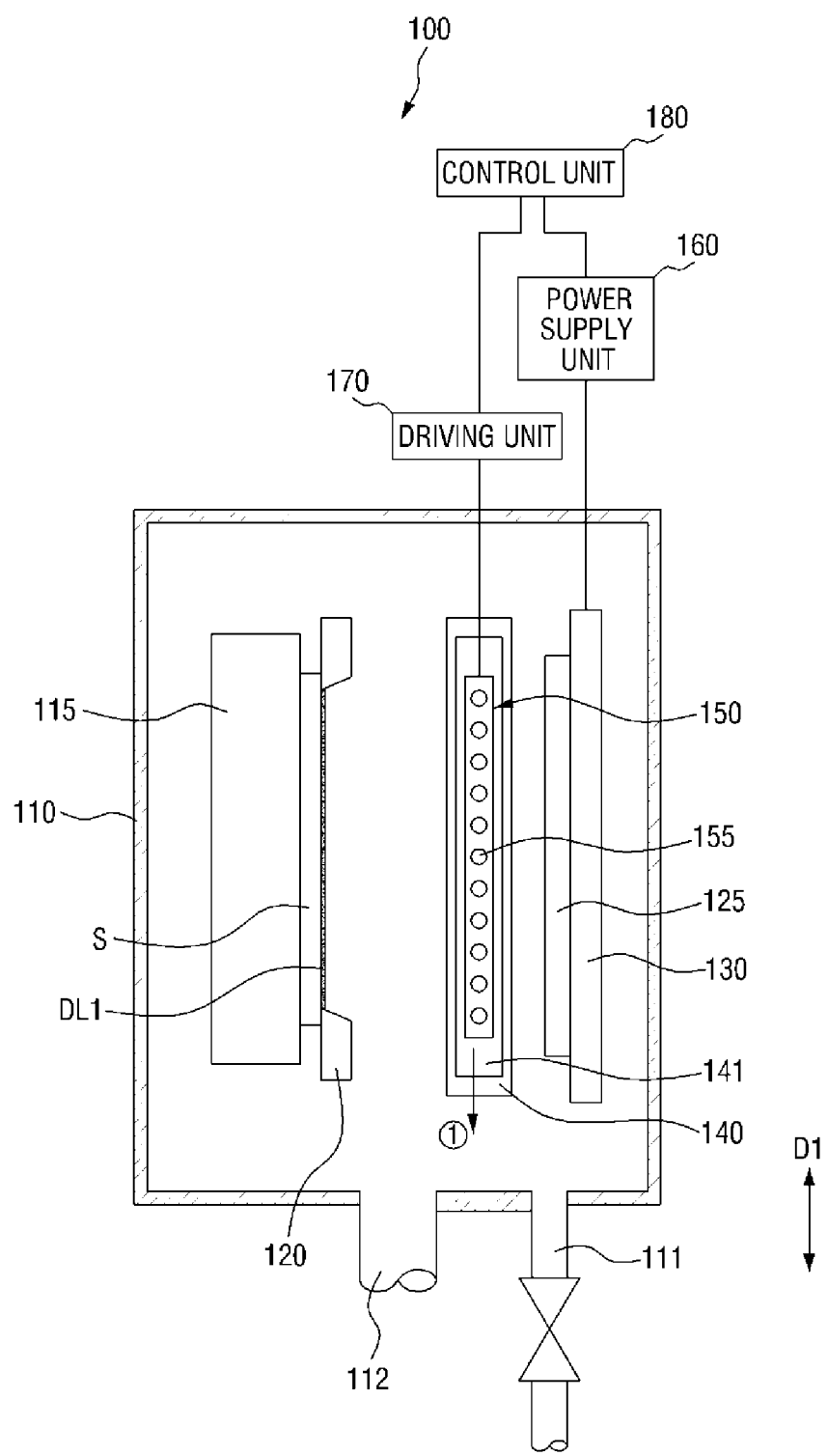

Specifically, referring to FIG. 7, the control unit 180 controls the driving unit 170 to start a sputtering process on the substrate S and, after a first predetermined time, move the moving members 150 in one direction along the first direction D, thereby horizontally moving the shield rods 155 as indicated by reference number ①. Then, the target particles of the target 125 are deposited on the portions of the substrate S which were corresponded to the shield bars 155 and on which the target particles of the target 125 were not deposited in FIG. 6. As a result, an overall uniform deposition layer DL1 may be formed on the substrate S. The one direction may be a direction from the first side of the target 125 toward the second side of the target 125.

Figure 8:
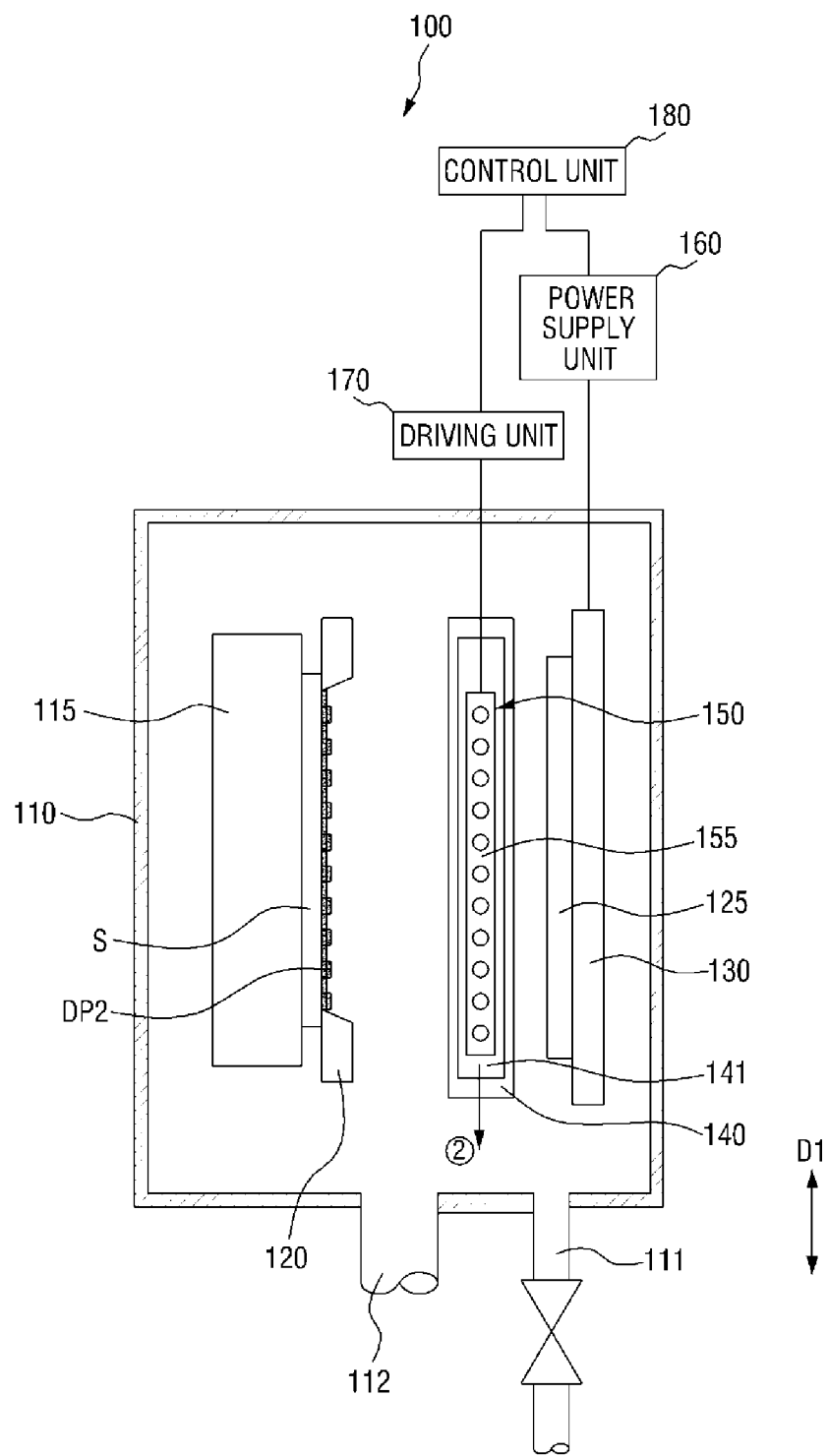

Referring to FIG. 8, during the sputtering process performed on the substrate S, the control unit 180 controls the driving unit 170 to further horizontally move the moving members 150 in the one direction along the first direction D1 at a second predetermined time after the first predetermined time, thereby horizontally moving the shield rods 155 as indicated by reference numeral ②. Then, the target particles of the target 125 are not deposited on the portions of the substrate S which correspond to the shield bars 155. As a result, deposition patterns DP2 may be formed on the substrate S. The second predetermined time may be, but is not limited to, immediately after the formation of the uniform deposition layer DL1 on the substrate S.

Figure 9:
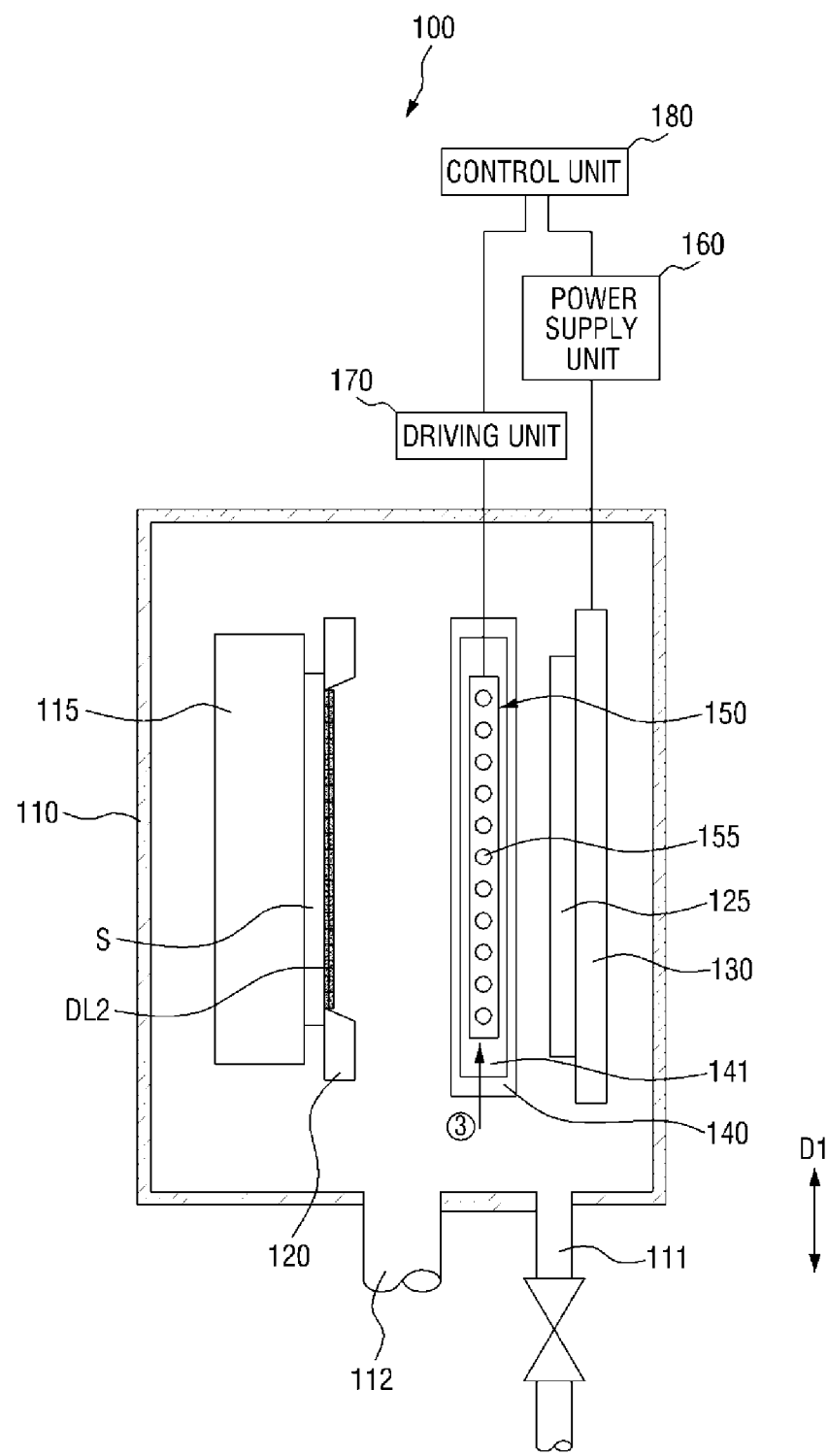

Referring to FIG. 9, during the sputtering process performed on the substrate S, the control unit 180 controls the driving unit 170 to horizontally move the moving members 150 in the other direction along the first direction D1 at a third predetermined time after the second predetermined time, thereby horizontally moving the shield rods 155 as indicated by reference numeral ③. Then, the target particles of the target 125 are deposited on the portions of the substrate S which corresponded to the shield rods 155 and on which the target particles of the target 125 were not deposited in FIG. 8. As a result, an overall uniform deposition layer DL2 may be formed on the substrate S. The other direction may be a direction from the second side of the target 125 toward the first side of the target 125.

Figure 10:
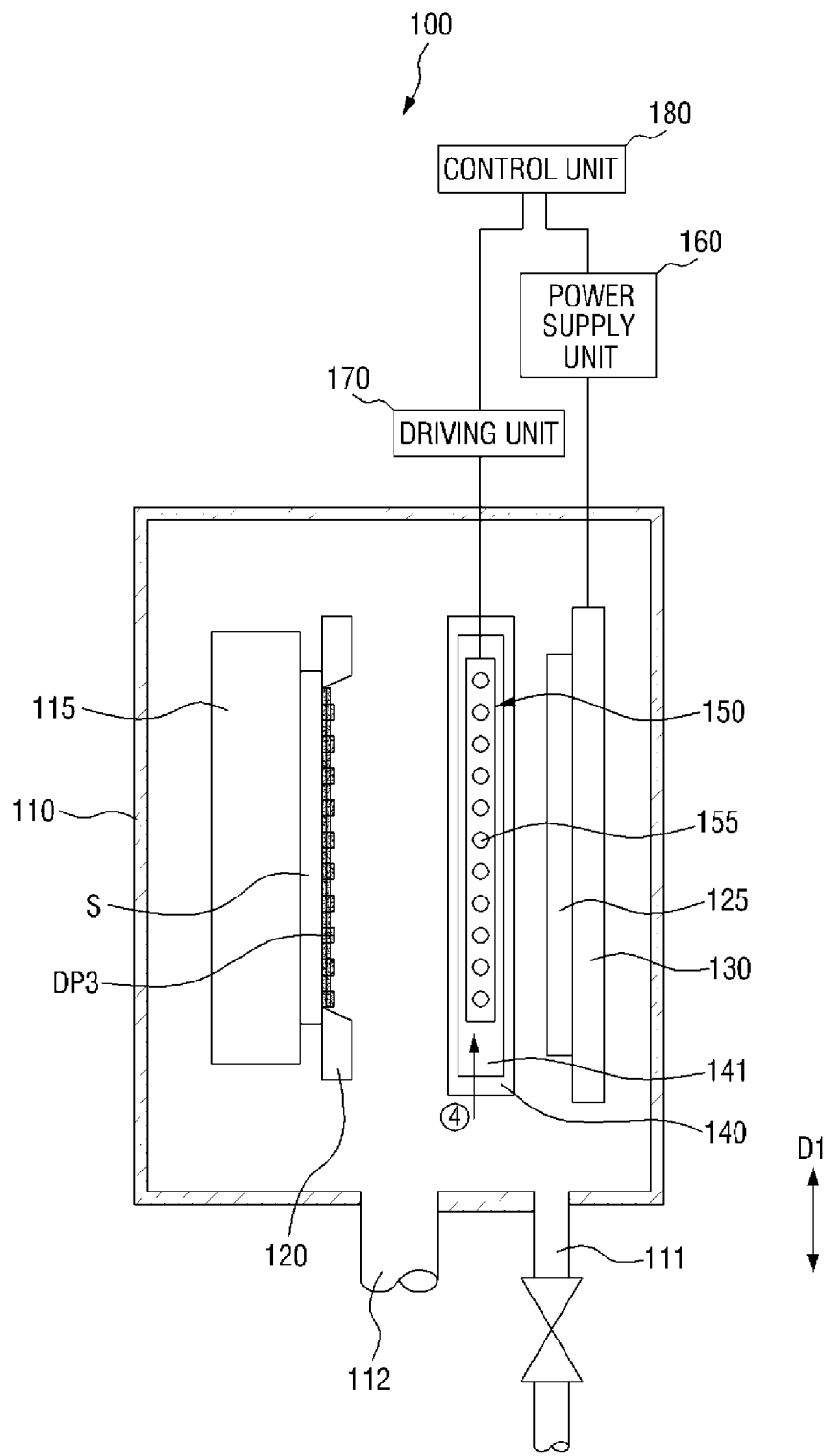

Referring to FIG. 10, during the sputtering process performed on the substrate S, the control unit 180 controls the driving unit 170 to further horizontally move the moving members 150 in the other direction along the first direction D1 at a fourth predetermined time after the third predetermined time, thereby horizontally moving the shield rods 155 as indicated by reference numeral ④. Then, the target particles of the target 125 are not deposited on the portions of the substrate S which correspond to the shield bars 155. As a result, deposition patterns DP3 may be formed on the substrate S. The fourth predetermined time may be, but is not limited to, immediately after the formation of the uniform deposition layer DL2 on the substrate S.

Figure 11:
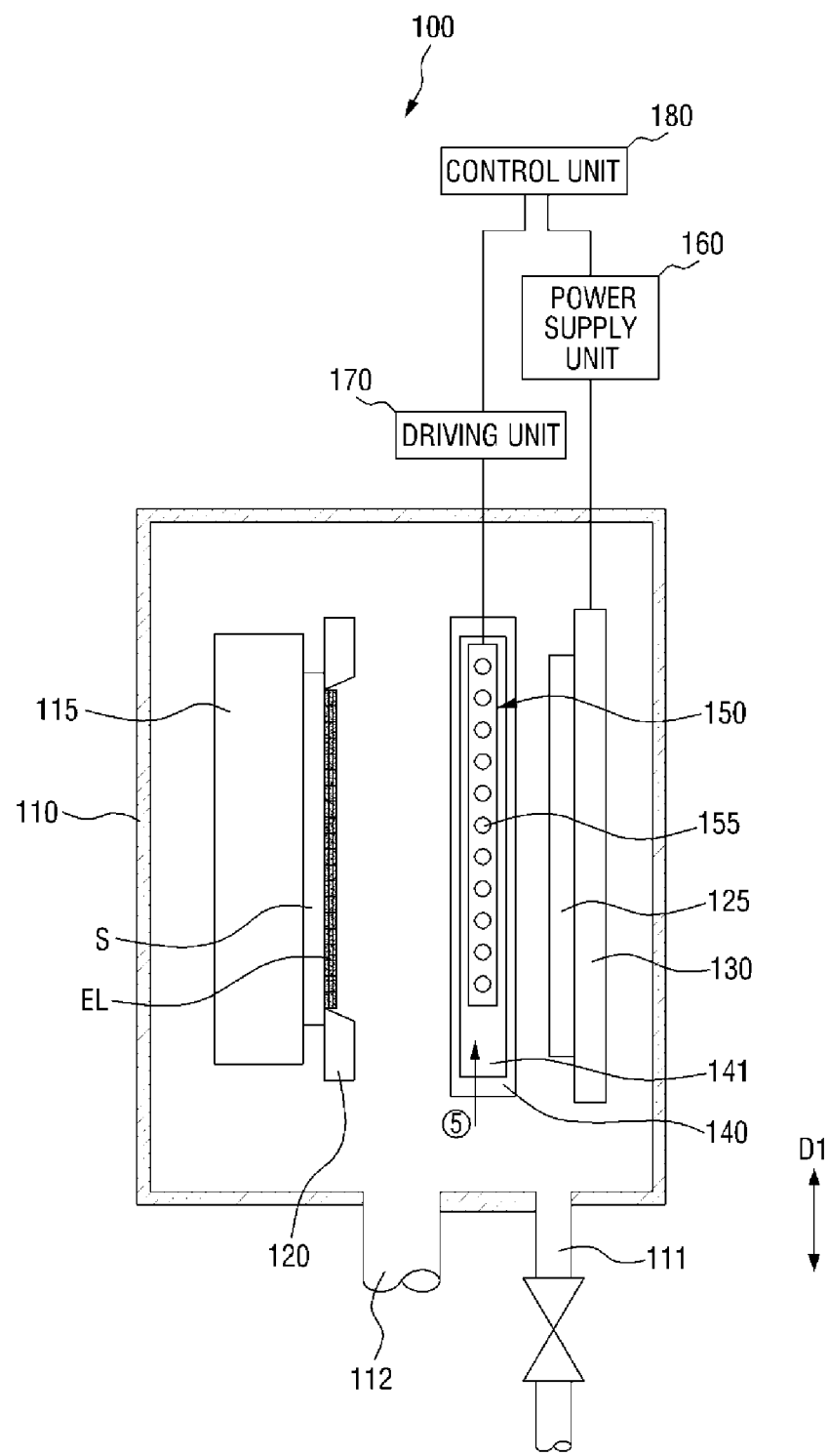

Referring to FIG. 11, during the sputtering process performed on the substrate S, the control unit 180 controls the driving unit 170 to further horizontally move the moving members 150 in the other direction along the first direction D1 at a fifth predetermined time after the fourth predetermined time, thereby horizontally moving the shield rods 155 as indicated by reference numeral ⑤. Then, the target particles of the target 125 are deposited on the portions of the substrate S which corresponded to the shield rods 155 and on which the target particles of the target 125 were not deposited in FIG. 10. As a result, a metal thin layer, for example, an electrode layer EL of a thin-film transistor is uniformly formed on the substrate S as illustrated in FIG. 11.

A sputtering device according to another embodiment of the present invention will now be described.

Figure 12:
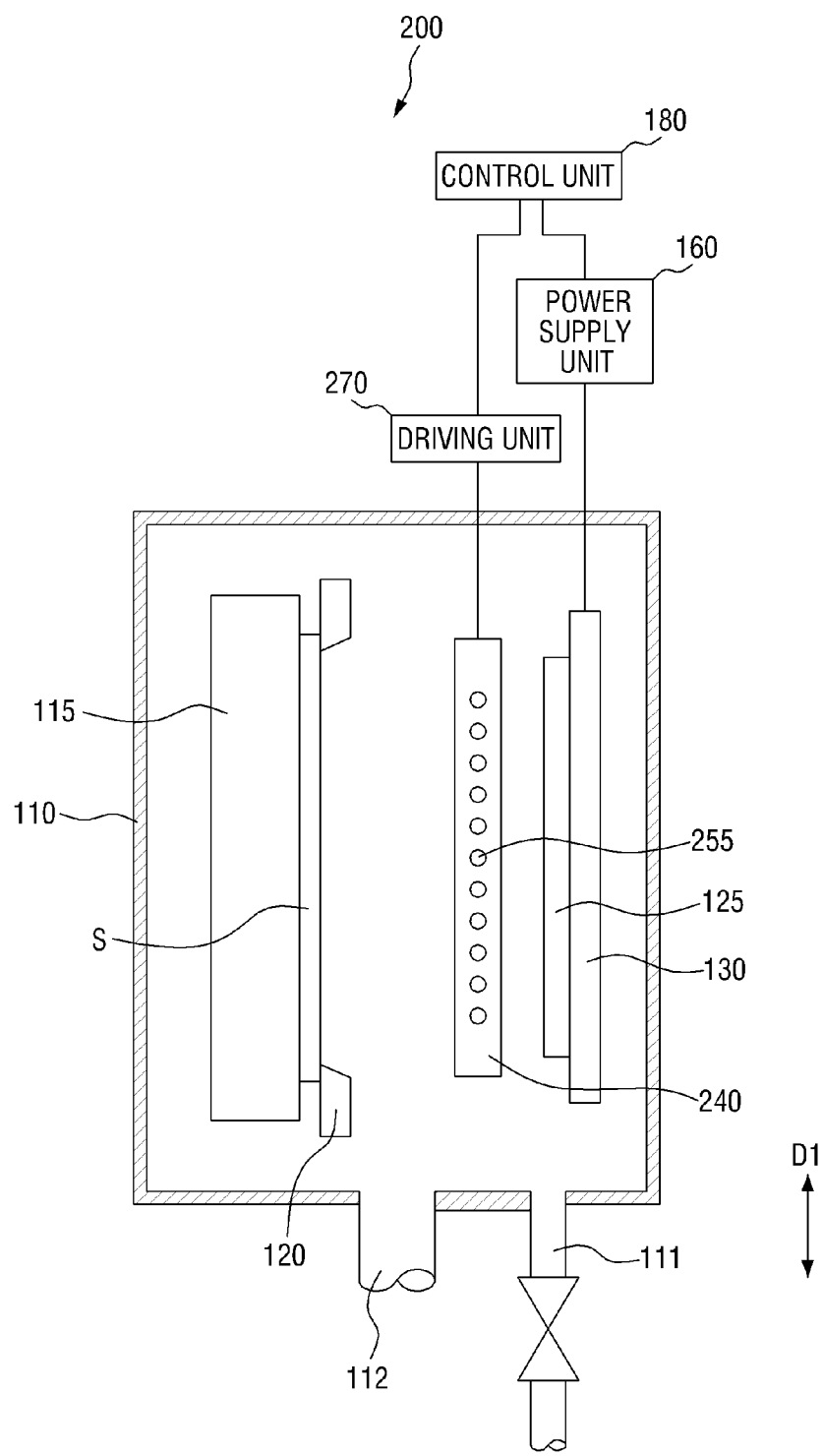
FIG. 12 is a schematic diagram of a sputtering device according to another embodiment of the present invention.
Figure 13:
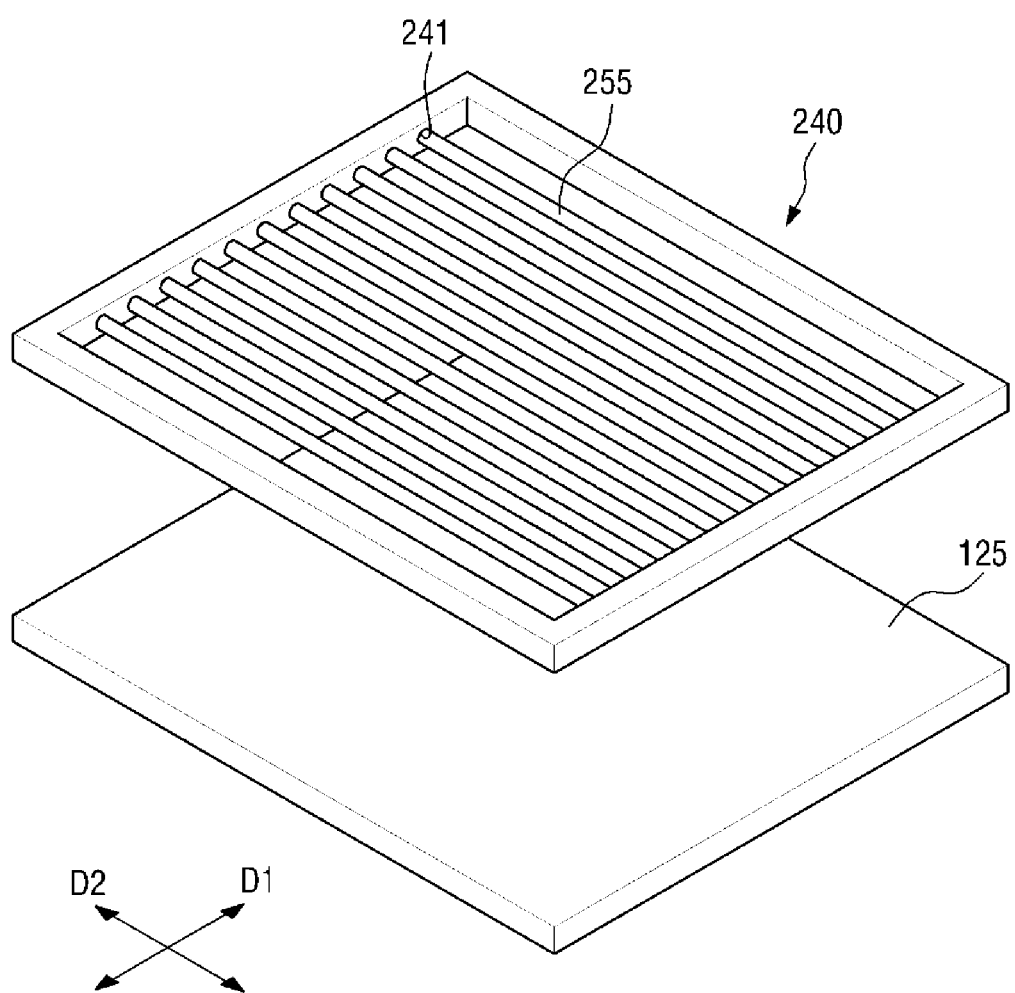
FIG. 13 is a perspective view illustrating the arrangement of a target, a shield mask, and shield rods illustrated in FIG. 12.
Figure 14:
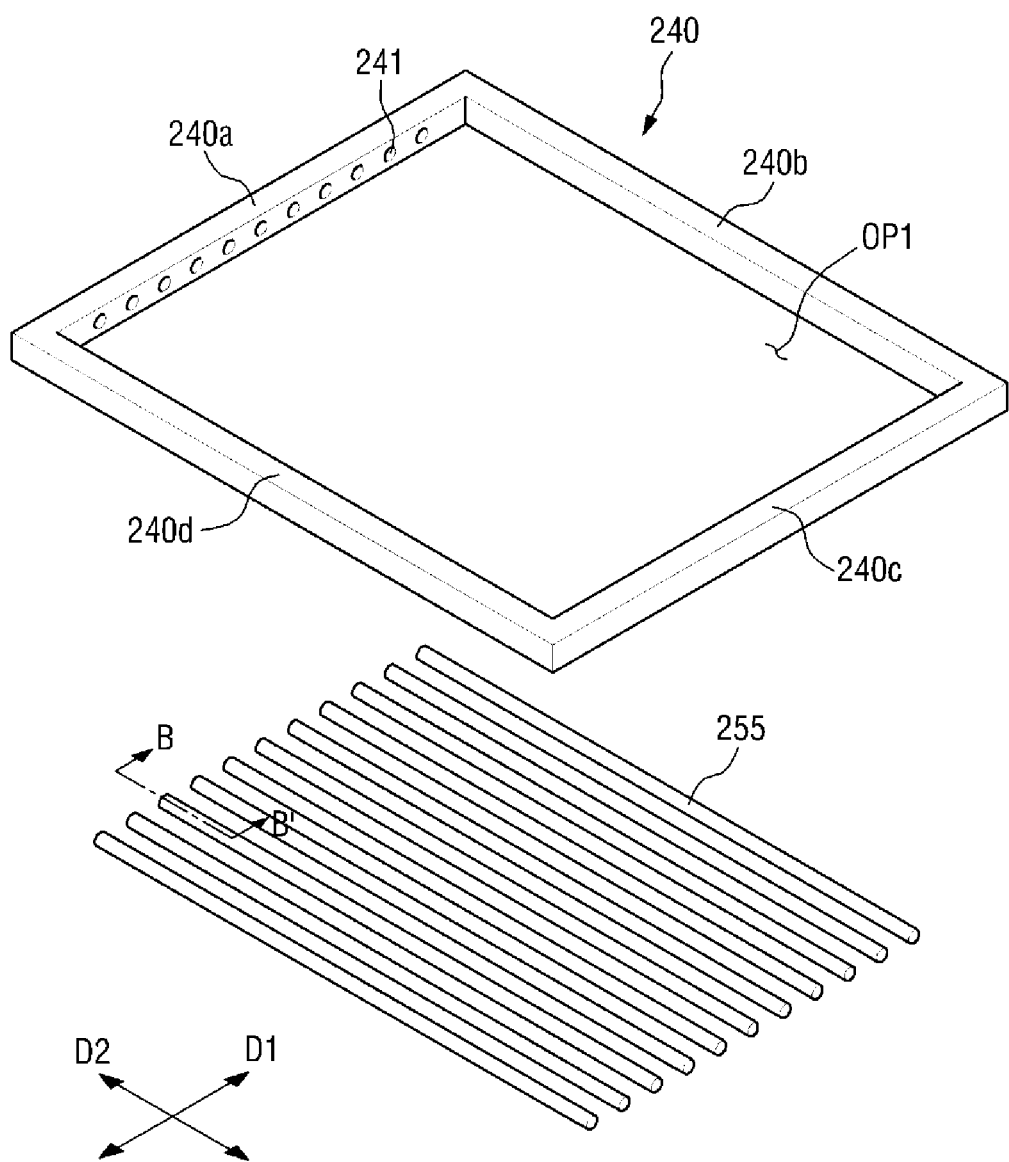
FIG. 14 is a perspective view of the shield mask and the shield rods separated from each other.
Figure 15:
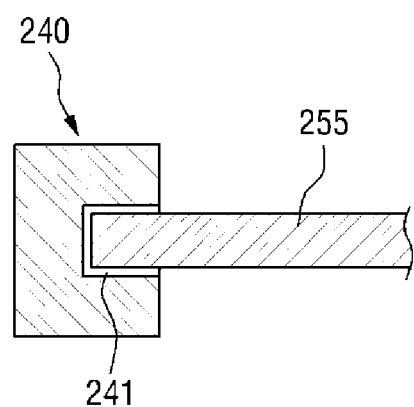
FIG. 15 is a cross-sectional view taken along the line B-B' of FIG. 14.
Figure 16:
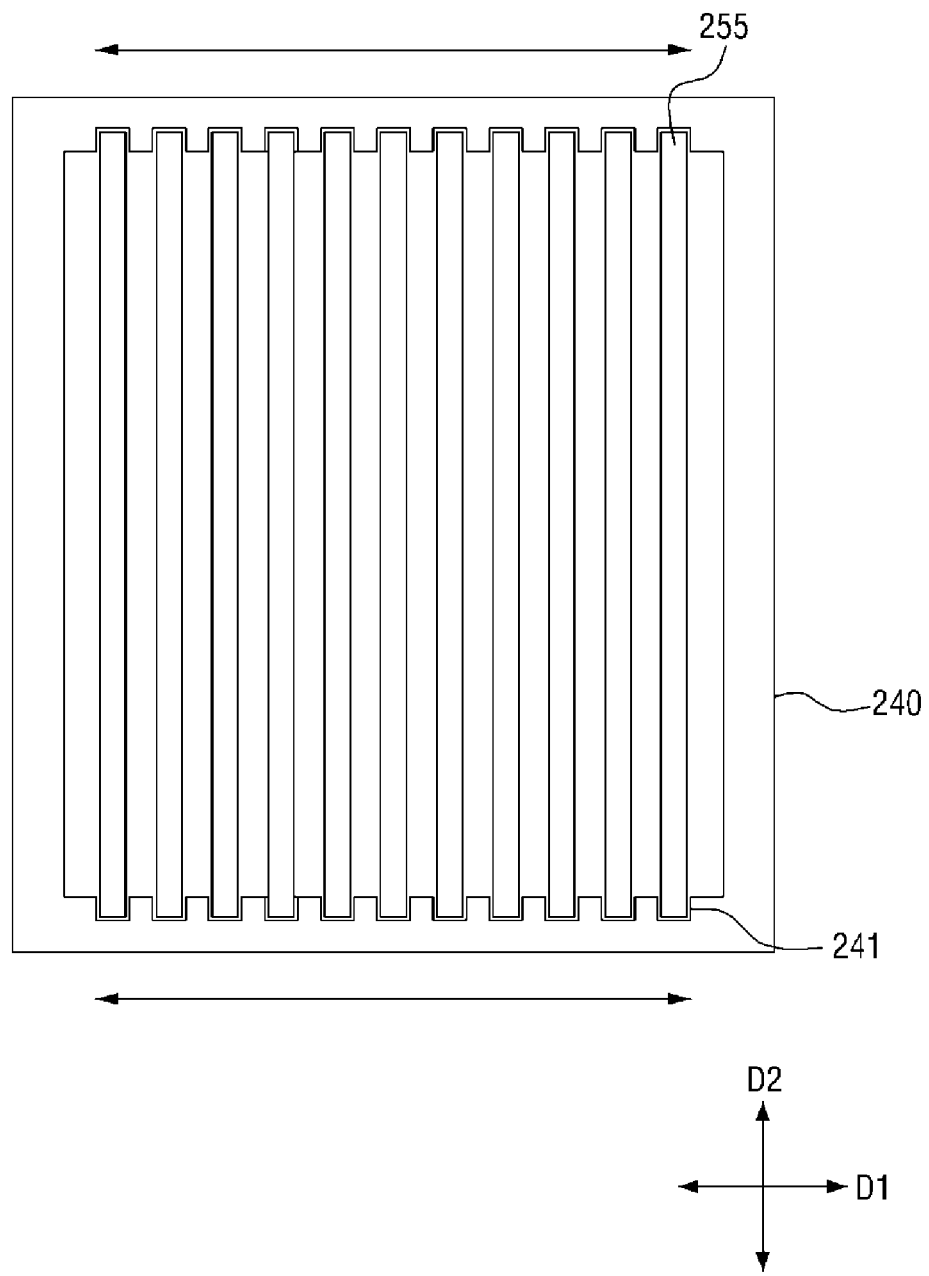
FIG. 16 is a plan view of the shield rods and the shield mask illustrated in FIG. 14.

FIG. 12 is a schematic diagram of a sputtering device 200 according to another embodiment of the present invention. FIG. 13 is a perspective view illustrating the arrangement of a target 125, a shield mask 240, and shield rods 255 illustrated in FIG. 12. FIG. 14 is a perspective view of the shield mask 240 and the shield rods 255 separated from each other. FIG. 15 is a cross-sectional view taken along the line B-B' of FIG. 14. FIG. 16 is a plan view of the shield rods 255 and the shield mask 240 illustrated in FIG. 14.

The sputtering device 200 according to the current embodiment has the same configuration as the sputtering device 100 of FIG. 1 except for the shield mask 240 and the omission of the moving members 150 of FIG. 1. Therefore, the sputtering device 200 according to the current embodiment will be described, focusing mainly on the shield mask 240 and elements connected to the shield mask 240.

Referring to FIGS. 12 through 16, the sputtering device 200 according to the current embodiment includes a chamber 110, a stage 115, a mask 120, the target 125, a backplate 130, the shield mask 240, the shield rods 255, a power supply unit 160, a driving unit 270, and a control unit 180.

The shield mask 240 is disposed between the stage 115 and the target 125. The shield mask 240 includes a plurality of sidewalls 240a, 240b, 240c, and 240d which define an opening OP1 and a plurality of coupling grooves 241 which are formed in two (240a and 240c) of the sidewalls 240a through 240d that face each other. The shield mask 240 may be configured to move horizontally in a first direction D1. For example, the shield mask 240 may be configured to move back and forth between first and second sides of the target 125 at a predetermined speed in the first direction D1. In some embodiments, the shield mask 240 may be configured to move horizontally from the first side of the target 125 toward the second side of the target 125 at a predetermined speed in the first direction D1 and then, without a halt, move horizontally from the second side toward the first side of the target 125 at the predetermined speed. Alternatively, the shield mask 240 may be configured to repeat moving horizontally from the first side toward the second side of the target 125 at a predetermined speed in the first direction D1 and then halting for a predetermined period of time and repeat moving horizontally from the second side toward the first side of the target 125 at the predetermined speed and then halting for the predetermined period of time.

The shield mask 240 is electrically independent from the target 125. The shield mask 240 is in an electrically ground state and forms an electric field with the target 125 to which power (e.g., negative (−) power) is supplied. The shield mask 240 may be made of aluminum or molybdenum. The opening OP1 may correspond to a substrate S.

The shield rods 255 are similar to the shield rods 155 of FIG. 1. However, the shield rods 255 may be coupled to the coupling grooves 241 of the shield mask 240 and separated from each other along the first direction D1. In addition, the shield rods 255 may move horizontally by the horizontal movement of the shield mask 240 during a sputtering process performed on the substrate S.

The driving unit 270 is similar to the driving unit 170 of FIG. 1. However, the driving unit 270 may drive the shield mask 240 and include, for example, a motor and a ball screw. The motor may move the shield mask 240 horizontally in the first direction D1.

As described above, the sputtering device 200 according to the embodiment includes the shield rods 255, which can move horizontally, in the shield mask 240 disposed between the stage 115 and the target 125 to form an electric field. Therefore, the sputtering device 200 can form a uniform electric field between the target 125 and the shield mask 240 and reduce occasions that the movement of target particles emitting from the target 125 is continuously hindered at certain parts.

Hence, the sputtering device 200 according to the embodiment can enhance the emission uniformity of target particles from the target 125 due to the non-uniform intensity of an electric field. It can enhance the uniformity of a thin layer, by reducing the chance that the shield rods 255 are fixed between the target 125 and the shield mask 240.

A method of forming a layer using the sputtering device 200 of FIG. 12 is similar to the layer forming method described above with reference to FIGS. 6 through 11, except that the shield rods 255 are moved horizontally by the horizontal movement of the shield mask 240. Therefore, a description of the method of forming a layer using the sputtering device 200 is omitted.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method for forming a thin layer, comprising:
   placing a substrate within a chamber;
   placing a target facing the substrate;
   depositing target particles emitting from the target on the substrate using a sputtering process; and
   moving a plurality of shield rods in a first direction, wherein
   the plurality of shield rods are installed in a shield mask and separated from each other along the first direction, and
   the shield mask is disposed between the substrate and the target, the shield mask comprising a plurality of sidewalls that define an opening and a plurality of grooves that are formed in two facing ones of the sidewalls.

2. The method of claim 1, wherein step of moving of the shield rods in a first direction comprises:
   moving the shield rods back and forth between a first side and a second side of the target.

3. The method of claim 1, wherein step of moving of the shield rods in a first direction comprises:
   moving the shield rods in the first direction at a predetermined speed in a direction from a first side of the target toward a second side of the target; and
   moving the shield rods in the first direction at the predetermined speed in a direction from the second side of the target toward the first side of the target.

4. The method of claim 1, wherein step of moving of the shield rods in a first direction comprises:
   repeating moving the shield rods in the first direction at a predetermined speed in a direction from a first side of the target toward a second side of the target and halting the shield rods for a predetermined period of time; and
   repeating moving the shield rods in the first direction at the predetermined speed in a direction from the second side of the target toward the first side of the target and halting the shield rods for the predetermined period of time.

5. The method of claim 1, wherein moving of the shield rods in a first direction is performed by moving a plurality of moving members that are housed in the shield mask and coupled to the shield rods in the first direction.

6. The method of claim 5,
   wherein the plurality of moving members are housed in the grooves of the shield mask, and
   wherein the grooves are housing grooves that are respectively formed in two facing ones of the sidewalls.

7. The method of claim 6, wherein each of the moving member comprises:
   a plurality of coupling grooves,
   wherein the shield rods are coupled to the coupling grooves.

8. The method of claim 1, wherein moving of the shield rods in a first direction is performed by moving the shield mask coupled to the shield rods in the first direction.

9. The method of claim 8,
   wherein the shield rods are coupled to the grooves of the shield mask, and
   wherein the grooves are coupling grooves that are formed in two facing ones of the sidewalls.

10. The method of claim 9, wherein the shield rods extend along a second direction substantially perpendicular to the first direction and are coupled to the coupling grooves.

11. The method of claim 1, wherein a diameter of each of the shield rods is equal to a distance between adjacent shield rods.

12. The method of claim 1, wherein a layer formed by the deposition of the target particles on the substrate is a metal thin layer.

13. A method for forming a thin layer, comprising:
   placing a substrate within a chamber;
   placing a target facing the substrate;
   depositing target particles emitting from the target on the substrate using a sputtering process; and
   moving a plurality of shield rods in a first direction,
   wherein the plurality of shield rods are installed in a shield mask and separated from each other along the first direction, the shield mask is disposed between the substrate and the target, and
   wherein moving of the shield rods in a first direction is performed by moving a plurality of moving members that are housed in the shield mask and coupled to the shield rods in the first direction.

14. A method for forming a thin layer, comprising:
   placing a substrate within a chamber;

placing a target facing the substrate;
depositing target particles emitting from the target on the substrate using a sputtering process; and
moving a plurality of shield rods in a first direction,
wherein the plurality of shield rods are installed in a shield mask and separated from each other along the first direction, the shield mask is disposed between the substrate and the target,
wherein moving of the shield rods in a first direction is performed by moving the shield mask coupled to the shield rods in the first direction, and
wherein the shield mask comprises: a plurality of sidewalls that define an opening; and a plurality of coupling grooves that are formed in two facing ones of the sidewalls.

* * * * *